United States Patent
Yamano

(10) Patent No.: US 12,424,583 B2
(45) Date of Patent: Sep. 23, 2025

(54) SEMICONDUCTOR MODULE

(71) Applicant: FUJI ELECTRIC CO., LTD., Kawasaki (JP)

(72) Inventor: Akio Yamano, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 570 days.

(21) Appl. No.: 17/855,782

(22) Filed: Jun. 30, 2022

(65) Prior Publication Data

US 2022/0336403 A1 Oct. 20, 2022

Related U.S. Application Data

(63) Continuation of application No. PCT/JP2021/021617, filed on Jun. 7, 2021.

(30) Foreign Application Priority Data

Jul. 7, 2020 (JP) ................................. 2020-117233

(51) Int. Cl.
*H01L 23/00* (2006.01)
*H01L 23/373* (2006.01)
(Continued)

(52) U.S. Cl.
CPC .......... *H01L 24/48* (2013.01); *H01L 23/3735* (2013.01); *H01L 25/072* (2013.01);
(Continued)

(58) Field of Classification Search
CPC ... H01L 24/48; H01L 23/3735; H01L 25/072; H01L 25/18; H01L 2224/48227; H01L 2924/1203; H01L 2924/13055
See application file for complete search history.

(56) References Cited

U.S. PATENT DOCUMENTS 5,644,147 A * 7/1997 Yamazaki ............. H01L 29/458
257/E29.147
5,767,567 A * 6/1998 Hu ........................ H01L 24/48
257/E23.044
(Continued)

FOREIGN PATENT DOCUMENTS

JP H1032218 A 2/1998
JP 2006066704 A 3/2006
(Continued)

OTHER PUBLICATIONS

International Search Report for PCT/JP2021/021617, mailed on Sep. 7, 2021.

*Primary Examiner* — Fernando L Toledo
*Assistant Examiner* — Ryan T. Fortin
(74) *Attorney, Agent, or Firm* — Rabin & Berdo, P.C.

(57) ABSTRACT

A semiconductor module includes a laminated substrate including an insulating board and a plurality of circuit boards that are arranged on an upper face of the insulating board, the plurality of circuit boards including first and second circuit boards, a semiconductor element disposed on the first circuit board and including, on an upper face of the semiconductor element, a main electrode, a gate pad, and a gate runner electrically connected to the gate pad, and a first wiring member electrically connecting the main electrode to the second circuit board. The gate runner extends so as to divide the main electrode into a plurality of electrodes including a first main electrode at a first side and a second main electrode at a second side, and the first wiring member is arranged to cross over the gate runner.

19 Claims, 14 Drawing Sheets

(51) Int. Cl.
  *H01L 25/07*     (2006.01)
  *H01L 25/18*     (2023.01)

(52) U.S. Cl.
  CPC .... *H01L 25/18* (2013.01); *H01L 2224/48227* (2013.01); *H01L 2924/1203* (2013.01); *H01L 2924/13055* (2013.01)

(56) References Cited

U.S. PATENT DOCUMENTS

| | | |
|---|---|---|
| 2002/0024134 A1 | 2/2002 | Arai et al. |
| 2016/0043073 A1* | 2/2016 | Tamura ............. H01L 29/66348 257/140 |
| 2018/0166549 A1* | 6/2018 | Kato ................... H01L 29/7397 |
| 2019/0287964 A1 | 9/2019 | Yamano et al. |
| 2019/0301946 A1* | 10/2019 | Sato .................... H01L 29/0834 |
| 2020/0161457 A1* | 5/2020 | Takahashi ........... H01L 29/0696 |
| 2020/0395343 A1* | 12/2020 | Kakefu ............... H01L 23/5386 |

FOREIGN PATENT DOCUMENTS

| | | | | |
|---|---|---|---|---|
| JP | 2010016103 A | 1/2010 | | |
| JP | 2010088299 A | 4/2010 | | |
| WO | WO-2015050262 A1 * | 4/2015 | ......... | H01L 27/0664 |
| WO | 2018225571 A1 | 12/2018 | | |
| WO | WO-2019159391 A1 * | 8/2019 | .......... | H01L 27/0711 |
| WO | WO-2020059285 A1 * | 3/2020 | ......... | H01L 23/3735 |

\* cited by examiner

SEMICONDUCTOR MODULE

CROSS REFERENCE TO RELATED APPLICATIONS

This is a continuation application of International Application PCT/JP2021/021617 filed on Jun. 7, 2021 which claims priority from a Japanese Patent Application No. 2020-117233 filed on Jul. 7, 2020, the contents of which are incorporated herein by reference.

BACKGROUND OF THE INVENTION

Technical Field

The present invention relates to a semiconductor module.

Background Art

A semiconductor device includes a substrate provided with semiconductor elements such as an IGBT (Insulated Gate Bipolar Transistor), a power MOSFET (Metal Oxide Semiconductor Field Effect Transistor) and an FWD (Free Wheeling Diode), and is used in an inverter device and the like.

In such a semiconductor module, a semiconductor element arranged on a predetermined substrate has a main electrode (may be also referred to as a surface electrode) and a gate electrode being formed on an upper face. The main electrode and the gate electrode are provided separately from each other. A main wire (main electric current wire) such as a bonding wire is connected to the main electrode, and a control wire is connected to the gate electrode (see, for example, Patent Literatures 1 to 3).

CITATION LIST

Patent Literature

Patent Literature 1: International Publication No. WO 2020/059285
Patent Literature 2: International Publication No. WO 2018/225571
Patent Literature 3: Japanese Patent Laid-Open No. 2010-016103

SUMMARY OF INVENTION

Incidentally, with an increase in capacity of a semiconductor module, an increase in the number of main wires connected to the main electrode is expected. In this case, depending on an arrangement relationship between the main electrode and the gate electrode, the number of the main wires may be limited. A smaller number of the main wires results in a greater amount of heat generation per main wire, whereby resistance of the semiconductor module may be affected.

The present invention has been made in view of the aforementioned circumstances, and one of objectives of the present invention is to provide a semiconductor module with which it is possible to secure the number of main wires being connected, and in turn to improve heat resistance.

A semiconductor module according to an aspect of the present invention includes: a laminated substrate in which a plurality of circuit boards are arranged on an upper face of an insulating board; a semiconductor element arranged on a predetermined circuit board and having on an upper face a main electrode, a gate pad, and a gate runner electrically connected to the gate pad; and a wiring member electrically connecting the main electrode with other circuit boards, wherein: the gate runner extends to divide the main electrode into one side and other side; and the wiring member is arranged to cross over the gate runner.

The present invention makes it possible to secure the number of main wires being connected, and in turn to improve heat resistance.

DESCRIPTION OF EMBODIMENTS

Figure 1:
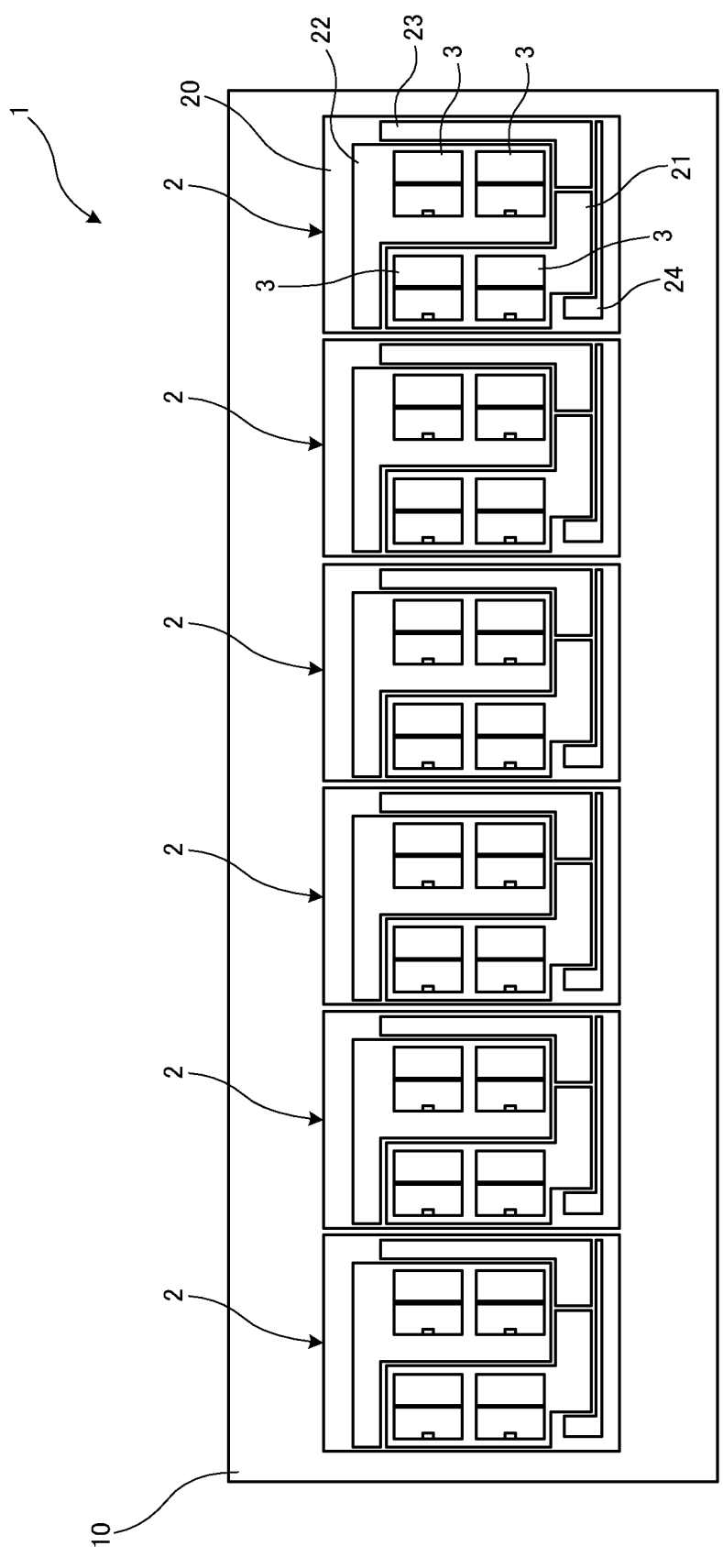
FIG. 1 is a plan view of a semiconductor module according to the present embodiment.
Figure 2:
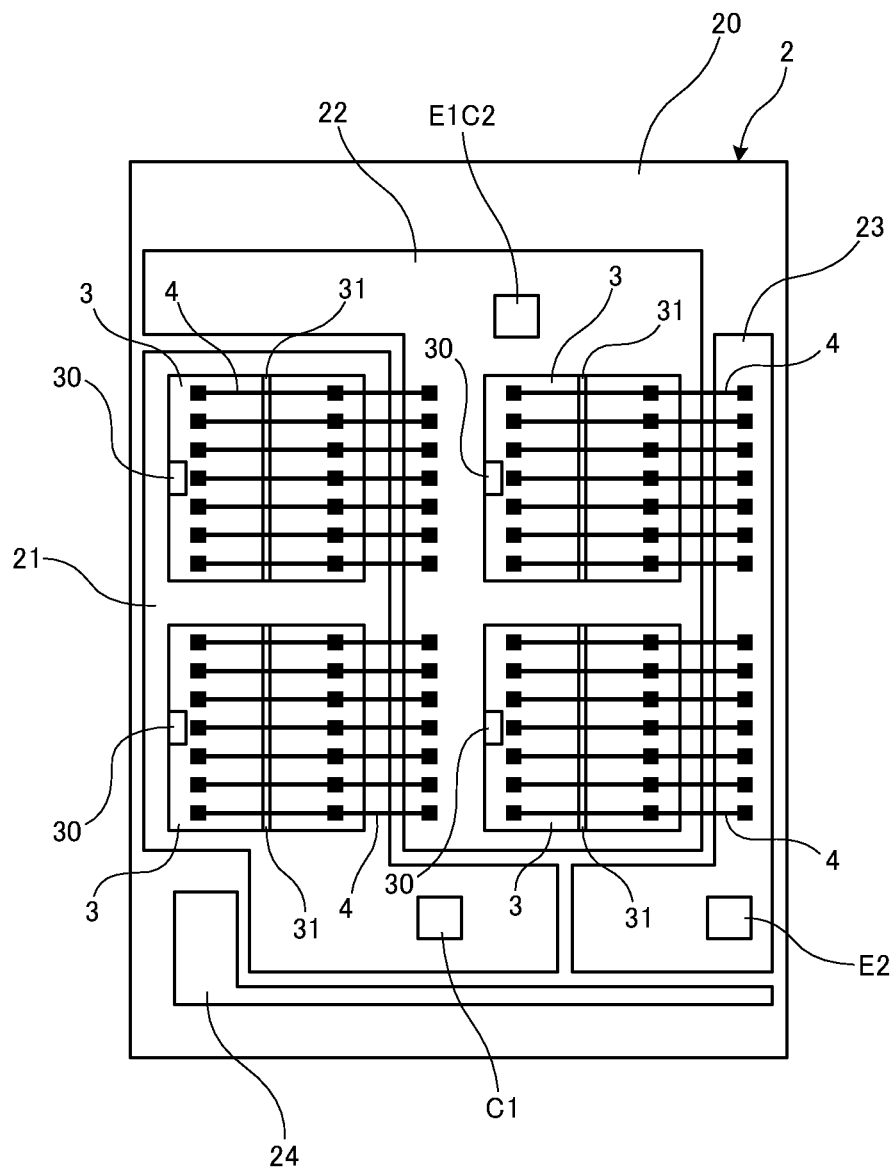
FIG. 2 is a partial enlarged view of FIG. 1 in a unit of a laminated substrate.
Figure 3:
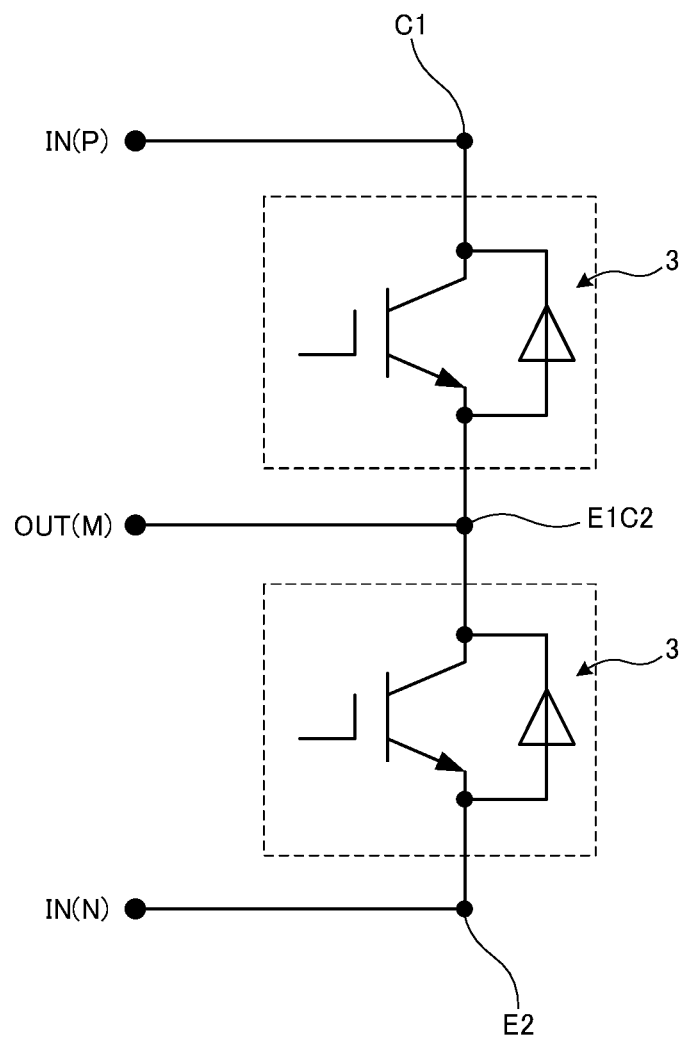
FIG. 3 is a schematic view showing an electric circuit according to the present embodiment.

A semiconductor module to which the present invention may be applied is described hereinafter. FIG. 1 is a plan view of the semiconductor module according to the present embodiment. FIG. 2 is a partial enlarged view of FIG. 1 in a unit of a laminated substrate. FIG. 3 is a schematic view showing an electric circuit according to the present embodiment. In FIG. 1, a case and main wires on chips are omitted for the sake of expediency of description. In FIG. 2, only the main wires are shown and control wires are omitted. Note that the semiconductor module described below is merely an example. The present invention is not limited thereto and may be modified as necessary.

In addition, in the following drawings, a longitudinal direction of the semiconductor module (direction in which a plurality of laminated substrates are arranged) is defined as an X direction, a shorter direction of the semiconductor module is defined as a Y direction, and a height direction (thickness direction of the substrate) is defined as a Z direction. The X, Y, and Z axes shown in the drawings are orthogonal to each other and constitute a right-handed system. In addition, the X direction may be referred to as a left-right direction, the Y direction may be referred to as a front-rear direction, and the Z direction may be referred to as an up-down direction as the case may be. These directions (front-rear, left-right, and up-down directions) are terms used for the sake of expediency of description, and a correspondence relationship with the respective X, Y, and Z directions may be different depending on the attachment attitude of the semiconductor module. For example, a heat radiation face side (cooling device side) of the semiconductor module is referred to as a lower face side, and an opposite side thereof is referred to as an upper face side. In addition, in the present specification, a planar view refers to a view of the upper face of the semiconductor module from a positive side in the Z direction. Furthermore, in the present specification, notations of directions and angles may be approximate, with a tolerance of ±10 degrees or less.

The semiconductor module according to the present embodiment is, for example, a power module and the like applied to a power conversion device, the power module constituting an inverter circuit. As shown in FIG. 1 and FIG. 2, a semiconductor module 1 is configured to include: a base board 10; a plurality of laminated substrates 2 arranged on the base board 10; and a plurality of semiconductor elements 3 arranged on the laminated substrate 2. Although not particularly illustrated, the semiconductor module 1 may also include a case accommodating the laminated substrate 2 and the plurality of semiconductor elements 3, and a sealing resin with which the case is filled (both not illustrated).

The base board 10 is a rectangular board with an upper face and a lower face. The base board 10 functions as a heat radiation board. In addition, the base board 10 has a rectangular shape in a planar view with a longer side in the X direction and a shorter side in the Y direction. The base board 10 is, for example, a metal plate formed of copper, aluminum, an alloy thereof, or the like, surfaces of which may have been subjected to plating processing.

On the upper face of the base board 10, the case having a rectangular shape in a planar view is arranged. The case is formed in a box-like shape with an opening on a lower side, so as to cover an upper side of the base board 10 and the plurality of semiconductor elements. The case defines a space accommodating the laminated substrate 2, the semiconductor element, the sealing resin, and the like.

The case is provided with an external terminal. For example, the external terminal includes a positive electrode terminal (P terminal), a negative electrode terminal (N terminal), an output terminal (M terminal), and also a control terminal. The positive electrode terminal, the negative electrode terminal, and the output terminal may be referred to as main terminals. The external terminal may include a plurality of control terminals. Each external terminal is formed by press processing and the like of a metal plate of a copper material, a copper alloy material, an aluminum alloy material, an iron alloy material, and the like.

In addition, on an inner side of the case 11, six laminated substrates 2 are arranged on the upper face of the base board 10. The laminated substrate 2 is formed in, for example, a rectangular shape in a planar view. The six laminated substrates 2 are arranged in a row in the X direction. The laminated substrate 2 is formed by laminating a metal layer and an insulating layer, and constituted of, for example, a DCB (Direct Copper Bonding) substrate, an AMB (Active Metal Brazing) substrate, or a metal-based substrate. Specifically, the laminated substrate 2 includes an insulating board 20, a heat radiation board (not illustrated) arranged on a lower face of the insulating board 20, and circuit boards 21 to 24 arranged on an upper face of the insulating board 20.

The insulating board 20 is formed in a planar shape having a predetermined thickness in the Z direction, with an upper face and a lower face. The insulating board 20 is formed of an insulating material, for example: a ceramic material such as alumina ($Al_2O_3$), aluminum nitride (AlN), and silicon nitride ($Si_3N_4$); a resin material such as epoxy; an epoxy resin material with a ceramic material as a filler; or the like. Note that the insulating board 20 may also be referred to as an insulating layer or an insulating film.

The heat radiation board is formed to have a predetermined thickness in the Z direction and to cover the substantial entirety of the lower face of the insulating board. The heat radiation board is formed of, for example, a metal plate having a favorable thermal conductive property such as a copper plate and an aluminum plate.

The plurality (four in the present embodiment) of circuit boards 21 to 24 are formed on the upper face (principal face) of the insulating board 20 independently in island-like shapes, in a state of being electrically insulated from each other. Among these, three circuit boards 21 to 23 constitute the main wire through which the main electric current passes. Meanwhile, the circuit board 24 constitutes the control wire for control. These circuit boards are constituted of metal layers of predetermined thicknesses formed of copper foil and the like. For example, the circuit boards 21 to 23 may be referred to as main wire layers, while the circuit board 24 may be referred to as a control wire layer.

The circuit board 21 is arranged on the upper face of the insulating board 20 in an off-center manner to a negative side in the X direction. The circuit board 21 extends in the Y direction along a side of the insulating board 20 with an end portion on a negative side in the Y direction being bent to a positive side in the X direction, to have an L-shape in a planar view. A pad portion C1 for external connection to which a collector electrode of an upper arm is connected is arranged at an end portion of the circuit board 21 on the negative side in the Y direction and the positive side in the X direction. The pad portion C1 is connected to an external power source positive potential point (P terminal) (see FIG. 3). In other words, the circuit board 21 constitutes the main wire layer of the upper arm.

The circuit board 22 is arranged on the upper face of the insulating board 20 in an off-center manner to a positive side in the X direction. The circuit board 22 extends in the Y direction along a side of the insulating board 20 with an end portion on a positive side in the Y direction being bent to a negative side in the X direction, to have an L-shape in a planar view. A pad portion E1C2 for external connection to which an emitter electrode of the upper arm and a collector electrode of a lower arm are connected is arranged at a corner portion of the L-shape of the circuit board 22. The pad portion E1C2 as an intermediate potential point (M terminal) is connected to an external load (see FIG. 3). In other words, the circuit board 22 constitutes a part of the main wire layer of the lower arm.

The circuit board 23 is arranged on the upper face of the insulating board 20 in an off-center manner to the positive side in the X direction with respect to the circuit board 22. The circuit board 23 extends in the Y direction along a side of the insulating board 20 with an end portion on the negative side in the Y direction being bent to the negative side in the X direction, to have an L-shape in a planar view. A pad portion E2 for external connection to which an emitter electrode of the lower arm is connected is arranged at a corner portion of the L-shape of the circuit board 23. The pad portion E2 is connected to an external power source positive potential point (N terminal) (see FIG. 3). In other words, the circuit board 23 constitutes a part of the main wire layer of the lower arm.

The circuit board 24 is arranged on the upper face of the insulating board 20 in an off-center manner to the negative side in the Y direction. The circuit board 24 extends in the X direction along a side of the insulating board 20 with an end portion on the negative side in the X direction being slightly bent to the positive side in the Y direction, to have an L-shape in a planar view.

End portions of the external terminals are connected to the upper faces of these circuit boards. Respective end portions of these external terminals are connected to the upper faces of the predetermined circuit boards directly by ultrasound bonding, laser bonding, or the like, or via a bonding material such as solder and a sintered metal. The end portions of the respective external terminals are thus conductively connected to the predetermined circuit boards. Description is omitted for connection relationships between the respective external terminals and the circuit boards.

Figure 6:
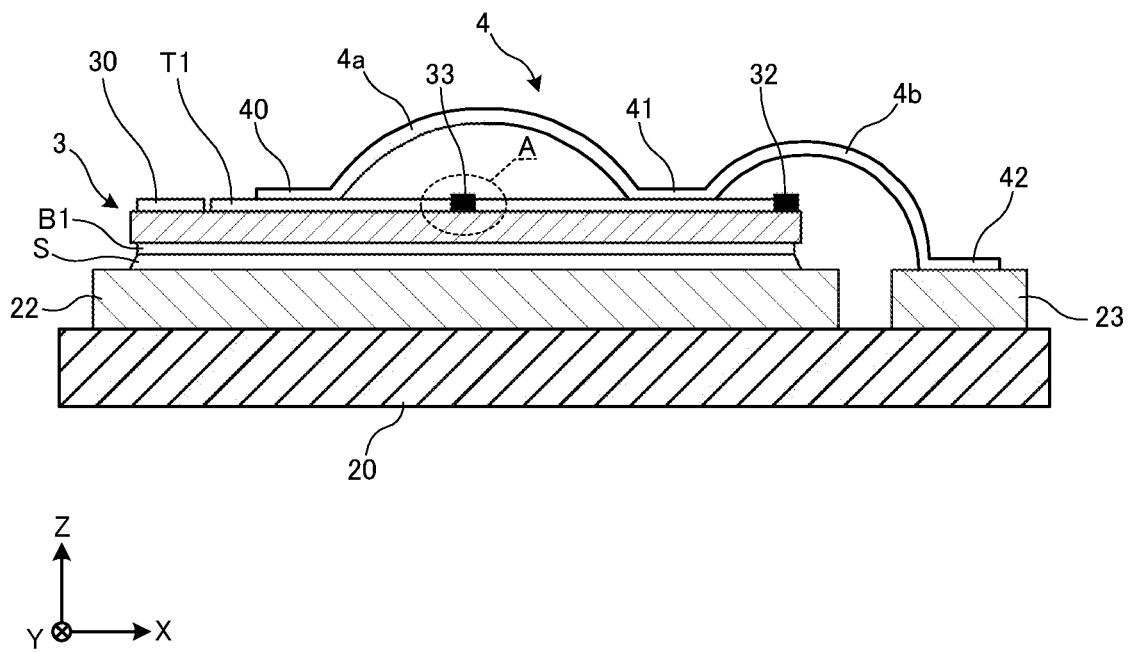
FIG. 6 is a cross-sectional view taken along a Z-X plane in FIG. 5.

The semiconductor element 3 is arranged on the upper face of the predetermined circuit board via a bonding material S such as solder (see FIG. 6). The semiconductor element 3 is formed in a square (or rectangular) shape in a planar view with a semiconductor substrate of, for example, silicon (Si), silicon carbide (SiC), gallium nitride (GaN), or the like. Note that, as a semiconductor element 3, a switching element such as an IGBT (Insulated Gate Bipolar Transistor) and a power MOSFET (Metal Oxide Semiconductor Field Effect Transistor), or a diode such as a FWD (Free Wheeling Diode) is used.

In the present embodiment, a case of using as the semiconductor element 3 an RC (Reverse Conducting)-IGBT element in which an IGBT and a FWD are integrated is described. Alternatively, as the semiconductor element 3, a power MOSFET element, an RB (Reverse Blocking)-IGBT having a sufficient breakdown voltage with respect to a reverse bias, or the like may also be used. In addition, the shape, the installation number, an installation site and the like of the semiconductor element 3 may be changed as necessary. Note that the semiconductor element 3 according to the present embodiment is a vertical switching element in which a functional element such as a transistor is formed on a semiconductor substrate.

On the semiconductor element 3, electrodes are formed on the upper face and the lower face respectively (see FIG. 6). For example, the electrode on the upper face side (upper face electrode T1) is constituted of an emitter electrode (source electrode). The electrode on the lower face side (lower face electrode B1) is constituted of a collector electrode (drain electrode). The upper face electrode T1 and the lower face electrode B1 may be referred to as main electrodes. A gate pad 30 and a gate runner 31 are formed on the upper face of the semiconductor element 3 (see FIGS. 5 and 6).

The gate pad 30 indicates an inlet of the main electric current for the semiconductor element 3. The gate pad 30 is formed in a region separated (independent) from the upper face electrode described above. The gate pad 30 is arranged on the outer peripheral side on the upper face of the semiconductor element 3. More specifically, the gate pad 30 is arranged on a center of a side of the semiconductor element 3. In FIG. 2, the gate pad 30 is arranged on a side of the semiconductor element 3 positioned on the negative side in the X direction. Note that the gate pad 30 may be referred to as a gate electrode.

The gate runner 31 constitutes a gate wire continued from the gate pad 30. In other words, the gate runner 31 constitutes a part of an electric current path for carrying an electric current in the semiconductor element 3. The gate runner 31 is formed to extend in the Y direction so as to divide a center of the semiconductor element 3 into two in the X direction. Detailed structures on the surface of the gate runner 31 and the semiconductor element 3 are described later.

The plurality of semiconductor elements 3 are arranged on the upper faces of the circuit boards 21, 22 via a bonding material (not illustrated) such as solder. The respective lower face electrodes of the semiconductor elements 3 are thus conductively connected to the circuit boards 21, 22. As a result, the respective external terminals and the respective semiconductor elements are conductively connected.

In the present embodiment, two semiconductor elements 3, four in total, are arranged on the upper face of each of the circuit boards 21, 22. On the circuit board 21, the two semiconductor elements 3 are arranged in a row in the Y direction. The two semiconductor elements 3 on the circuit board 21 constitute the upper arm. On the circuit board 22, the two semiconductor elements 3 are arranged in a row in the Y direction. The two semiconductor elements 3 on the circuit board 22 constitute the lower arm. The upper arm and the lower arm are arranged opposite to each other in the X direction. The upper arm is positioned on the negative side in the X direction, while the lower arm is positioned on the positive side in the X direction.

The upper face electrode of the semiconductor element 3 and the predetermined circuit board are electrically connected by a wiring member 4 such as a wire. For example, the upper face electrode of the semiconductor element 3 constituting the upper arm is connected to the circuit board 22 via the wiring member 4. The upper face electrode of the semiconductor element 3 constituting the lower arm is electrically connected to the circuit board 23 via the wiring member 4.

The semiconductor element 3 is connected to the predetermined circuit board by so-called stitch bonding, by which bonding is carried out continuously at a plurality of bonding points without cutting the wire at each bonding point. Specifically, as shown in FIG. 2, the wiring member 4 has two connecting points (connecting areas) 40, 41 on the upper face of the semiconductor element 3 (see FIGS. 4 and 5), and a connecting point 42 on the predetermined circuit board (circuit board 22 or circuit board 23) (see FIGS. 4 and 5). The number of connecting points is not limited thereto and may be changed as necessary.

The wiring member 4 is arranged to extend in the X direction in a planar view. In addition, the wiring member 4 extends to form an arch between adjacent connecting points seen from the Y direction. As described later in detail, the wiring member 4 is arranged to cross over the gate runner 31 extending in the Y direction. In other words, the gate runner 31 is arranged to pass under the wiring member 4 between the connecting points 40, 41.

In addition, a plurality of wiring members 4 are arranged for each semiconductor element 3. More specifically, for example seven wiring members 4 are arranged in a row in the Y direction. The number of wiring members 4 is not limited thereto and may be changed as necessary.

As these wiring members 4, conductive wires (bonding wires) are used. The material of the conductive wire may be gold, copper, aluminum, a gold alloy, a copper alloy, an aluminum alloy, or a combination thereof. Alternatively, a member other than the conductive wire may be used as the wiring member 4. For example, a ribbon may be used as the wiring member 4. Yet alternatively, the wiring member 4 is not limited to the wire or the like, and may be formed of a ribbon or a metal plate of a copper material, a copper alloy material, an aluminum alloy material, an iron alloy material, or the like.

Incidentally, with an increase in capacity of a semiconductor module, an increase in the number of wiring members (main wires) connected to the upper face electrode (main electrode) of the semiconductor element is expected. In this case, depending on an arrangement relationship between the main electrode and the gate electrode (gate pad), the number of the wiring members may be limited. A smaller number of the wiring members results in a greater amount of heat generation per wiring member, whereby resistance of the semiconductor module may be affected.

In this regard, the present inventor has focused on an inner structure of the semiconductor element, the gate runner on the surface, and a positional relationship with the wiring members, and thus conceived the present invention.

Figure 4:
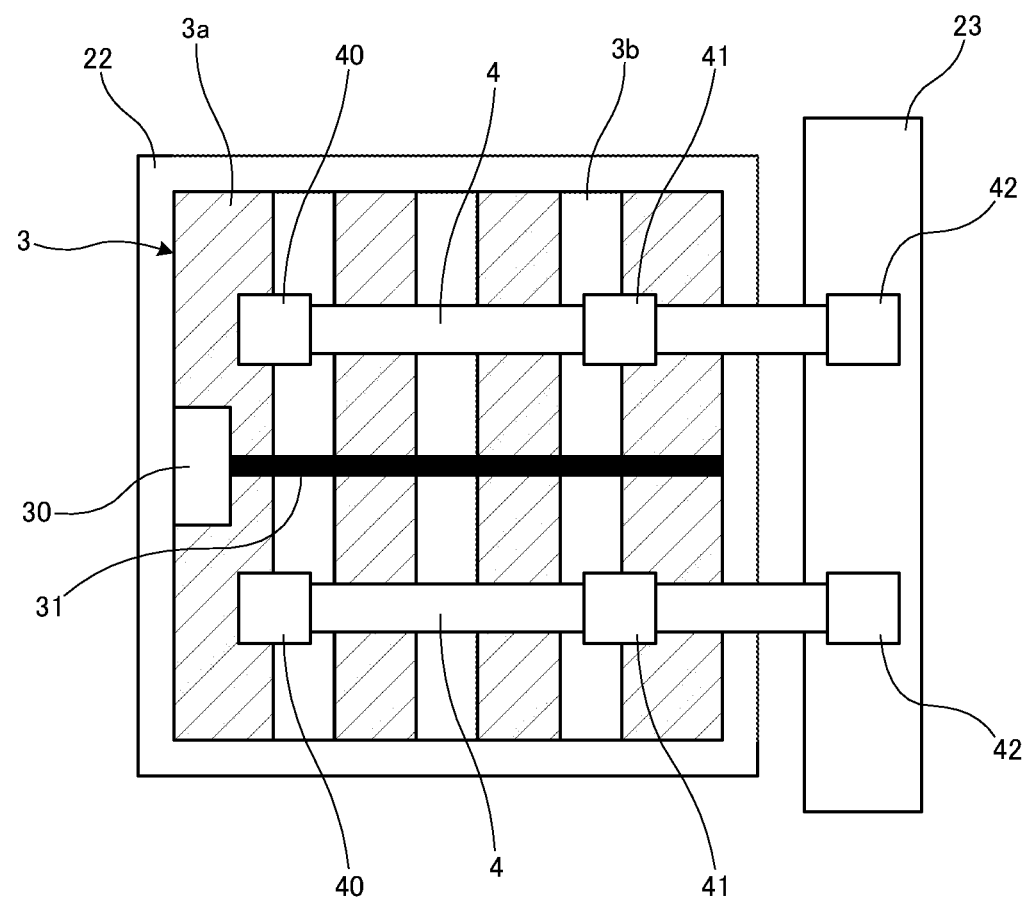
FIG. 4 is a plan view of the vicinity of a semiconductor element according to a reference example.
Figure 5:
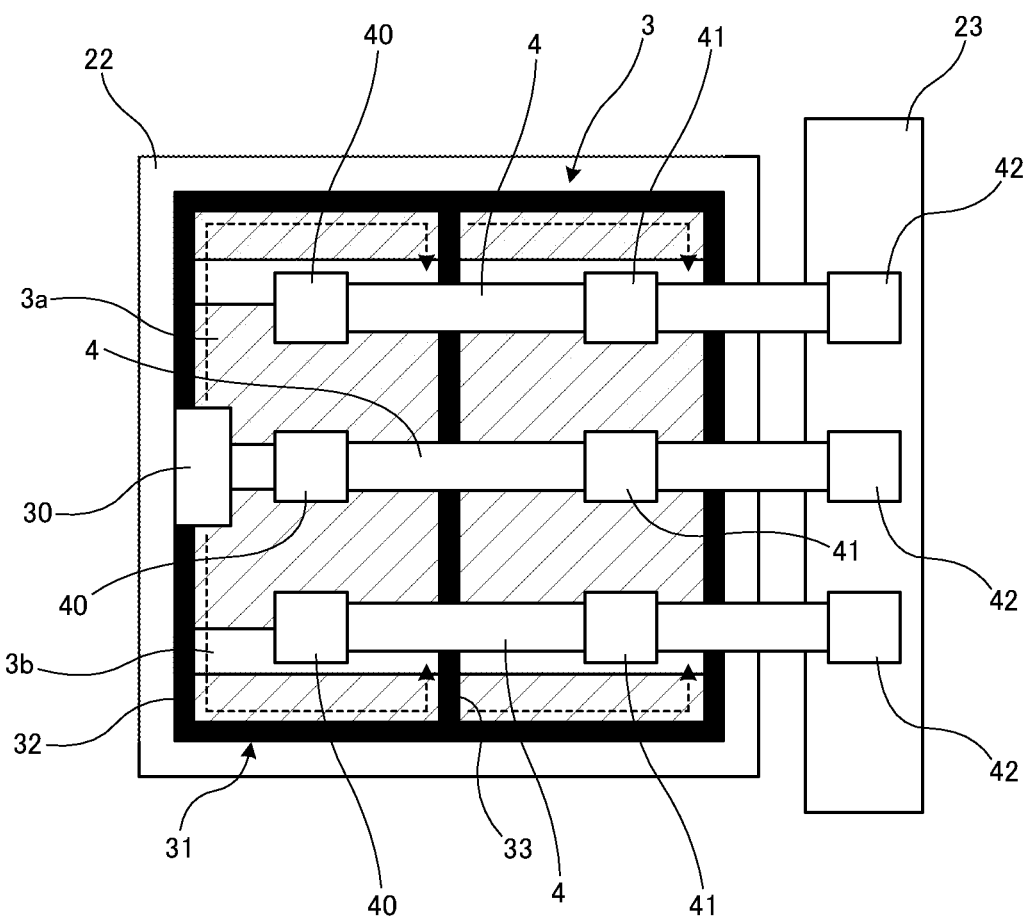
FIG. 5 is a plan view of the vicinity of a semiconductor element according to the present embodiment.
Figure 5:
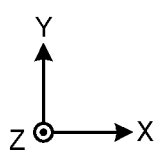

Hereinafter, a surface structure of the semiconductor element according to the present embodiment is described in detail with reference to FIG. 4 to FIG. 7. FIG. 4 is a plan view of the vicinity of a semiconductor element according to a reference example. FIG. 5 is a plan view of the vicinity of a semiconductor element according to the present embodiment. Note that in FIG. 4 and FIG. 5, illustration is given with omission of the upper face electrode of the semiconductor element, and the inner structure (the IGBT region and the FWD region described later) being visible in a planar view. The actual inner structure is covered by the upper electrode and not visible on the surface. Note that FIG. 4 to FIG. 7 are provided with a common basic structure, only with partial differences in layout of the inner structure.

Consequently, configurations with the common name are denoted by the same reference sign and description thereof is omitted. In addition, the following drawings show the lower arm side as an example. In other words, the following structure may also be provided on the upper arm side.

As described above, the semiconductor element 3 is an RC-IGBT element in which an IGBT and an FWD are integrated. The RC-IGBT element includes IGBT regions 3a and FWD regions 3b which are strip-shaped in a planar view, below the upper face electrode.

As shown in FIG. 4, the semiconductor element 3 includes a plurality of IGBT regions 3a extending in the Y direction and a plurality of FWD regions 3b extending in the Y direction. The IGBT regions 3a and the FWD regions 3b are alternately arranged in a row in the X direction. In FIG. 4, four IGBT regions 3a and three FWD regions 3b are arranged.

In addition, as described above, the gate pad 30 is arranged on a side of the semiconductor element 3 positioned on the negative side in the X direction. In other words, the gate pad 30 is arranged in an off-center manner on a side positioned on an outer peripheral edge of the semiconductor element 3. In addition, the gate runner 31 continued from the gate pad 30 is arranged on the upper face of the semiconductor element 3.

The gate runner 31 extends from the gate pad 30 positioned on the negative side in the X direction toward the positive side in the X direction. The gate runner 31 divides a center of the upper face of the semiconductor element 3 into two in the Y direction. The extension direction of the gate runner 31 and the extension direction of the IGBT regions 3a and the FWD regions 3b are orthogonal.

In addition, the circuit board 23 is arranged on an outer side of a side opposite to the side of the semiconductor element 3 on which the gate pad 30 is arranged. In other words, the circuit board 23 is arranged on an opposite face of the gate pad 30, across another side of the semiconductor element 3.

The upper face electrode of the semiconductor element 3 and the circuit board 23 are connected by the wiring member 4. The wiring member 4 has two connecting points 40, 41 on the upper face of the semiconductor element 3, and a connecting point 42 on the circuit board 23. The wiring member 4 extends in the X direction in a planar view. The wiring member 4 extends in parallel to the gate runner 31. The extension direction of the wiring member 4 and the extension direction of the IGBT regions 3a and the FWD regions 3b are orthogonal.

As shown in FIG. 4, in the reference example, two wiring members 4 extending in the X direction are arranged in a row in the Y direction. With the wiring member 4, the connecting point cannot be arranged to overlap the gate runner 31. As described above, in the reference example, the wiring member 4 and the gate runner 31 are parallel to each other. Given this, an attempt to arrange the wiring member 4 so as to bypass the gate runner 31 limits the number of the wiring members 4.

In addition, the present invention is not limited to FIG. 4 and the extension direction of the gate runner 31 and the extension direction of the IGBT regions 3a and the FWD regions 3b may also be assumed to be parallel. In this case, equal electric current flow from the gate runner to each region may be unlikely. As a result, electric current imbalance may be occurred, increasing likelihood of out-of-sync timing of switching.

In this regard, in the present embodiment, the gate runner 31 is formed in a rectangular frame shape surrounding the entire outer peripheral edge of the semiconductor element 3 as shown in FIG. 5. Specifically, the gate runner 31 includes an outer peripheral portion 32 and a linear portion 33.

The outer peripheral portion 32 extends from the gate pad 30 along the outer peripheral edge of the semiconductor element 3. More specifically, the outer peripheral portion 32 is formed to extend from both end portions of the gate pad 30 in the Y direction, along the outer peripheral edge of the semiconductor element 3, and to surround the outer peripheral edge of the semiconductor element 3 (outer peripheral edge of the upper face electrode), thus forming a rectangular frame shape. The linear portion 33 connects sides of the outer peripheral portion 32 opposite to each other in the Y direction, in a center in the X direction. The linear portion 33 extends in the Y direction so as to divide a center of the semiconductor element 3. In other words, the linear portion 33 divides the upper face (upper face electrode) of the semiconductor element into one side (negative side in the X direction) and the other side (positive side in the X direction).

Note that the outer peripheral portion 32 is not limited to a configuration of surrounding the entire outer peripheral edge of the semiconductor element 3. For example, the outer peripheral portion 32 is only required to be on at least one side (negative side in the X direction), in other words on the negative side in the X direction with respect to the linear portion 33.

Figure 7:
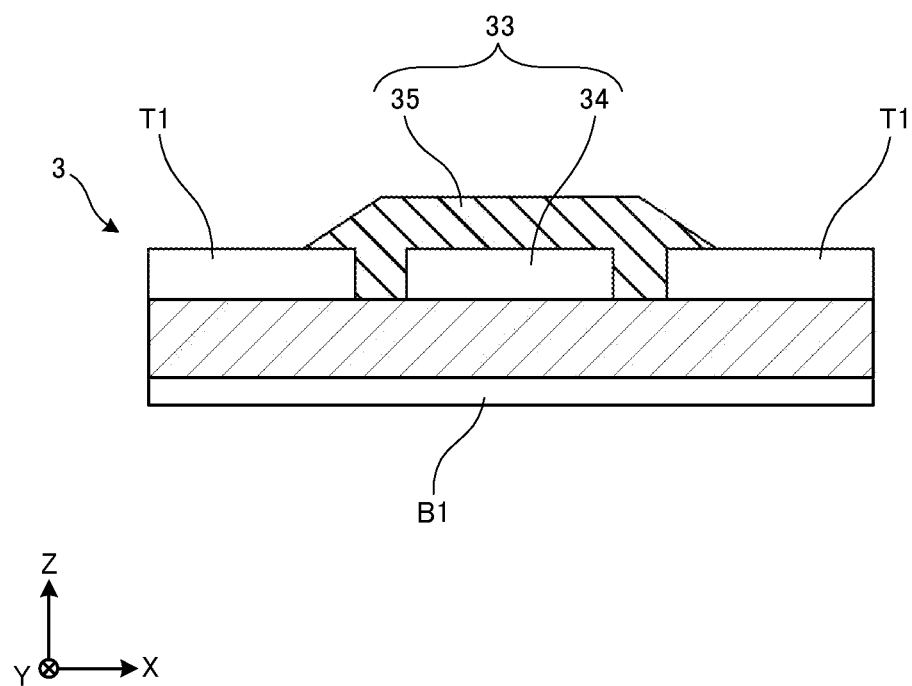
FIG. 7 is an enlarged view of a portion A in FIG. 6.

Hereinafter, a cross-sectional shape of the gate runner 31 is described. As shown in FIG. 6 and FIG. 7, the gate runner 31 (the outer peripheral portion 32 and the linear portion 33) includes a gate wiring layer 34 and an insulating film 35. The gate wiring layer 34 is formed independently from the upper face electrode T1, and constituted of a metal layer of a similar material to the upper face electrode T1. The insulating film 35 covers the gate wiring layer 34, and is formed of, for example, a resin such as polyimide. The insulating film 35 covers the upper portion of the gate wiring layer 34, as well as an edge portion of the upper face electrode T1. Consequently, the insulating film 35 includes an external surface shape bulging upward with respect to the gate wiring layer 34 and the upper face electrode T1.

In a similar manner to the foregoing, the wiring member 4 extends in the X direction in a planar view. The wiring member 4 has two connecting points 40, 41 on the upper face of the semiconductor element 3, and a connecting point 42 on the circuit board 23. As described above, on the upper face of the semiconductor element 3, the plurality of wiring members 4 preferably have at least one connecting point in a region on the one side and in a region on the other side divided by the linear portion 33. As described later in detail, each of the connecting points preferably overlaps both the IGBT region 3a and the FWD region 3b.

In particular, in the present embodiment, the linear portion 33 extends to pass under the wiring member 4. In other words, the wiring member 4 is arranged to cross over the linear portion 33. Specifically, the wiring member 4 further includes a first arch portion 4a and a second arch portion 4b (see FIG. 6).

The first arch portion 4a is continued from the connecting points 40, 41 and is formed in an upward convex arch shape between the connecting points 40 and 41. The second arch portion 4b is continued from the connecting points 41, 42 and is formed in an upward convex arch shape between the connecting points 41 and 42. The first arch portion 4a crosses over a part of the gate runner 31 (linear portion 33). Similarly, the second arch portion 4b crosses over a part of the gate runner 31 (a part of the outer peripheral portion 32).

As described above, due to the wiring member 4 and the gate runner 31 (linear portion 33) intersecting in a planar view, a larger number of wiring members 4 can be arranged on the upper face electrode without the need for paying attention to the installation position of the wiring member 4. For example in FIG. 5, three wiring members 4, greater in number than in FIG. 4, are arranged on the upper face electrode.

As described above, the present embodiment makes it possible to secure the number of the wiring members 4 (main wires) being connected, and in turn to increase the number of the connecting points 40, 41 of the wiring member 4 with respect to the upper face electrode. As a result, the amount of heat generation per connecting point can be reduced, whereby disproportion in heat distribution can be reduced. Therefore, heat resistance of the semiconductor module 1 can be improved.

In addition, in the present embodiment, the semiconductor element 3 has a rectangular shape in a planar view and further includes the gate pad 30 arranged on a side of the rectangular shape (a side corresponding to the negative side in the X direction, that is the one side of the semiconductor element 3). Furthermore, with respect to the circuit board 22, the circuit board 23 (other circuit board) is arranged on an opposite face of the gate pad 30, across another side of the semiconductor element 3 (a side corresponding to the positive side in the X direction, that is the other side of the semiconductor element 3). According to this configuration, a control wire (not illustrated) connected to the gate pad 30 can be arranged on the negative side in the X direction, that is the one side. Meanwhile, the wiring member 4, which is the main wire, can be arranged on the positive side in the X direction, that is the other side of the control wire. In other words, the control wire and the main wire can be separately arranged without overlapping.

In addition, in the present embodiment, the semiconductor element 3 is an RC-IGBT element in which an IGBT and an FWD are integrated. The RC-IGBT element includes IGBT regions 3a and FWD regions 3b which are strip-shaped in a planar view, below the upper face electrode.

As shown in FIG. 5, the semiconductor element 3 includes a plurality of IGBT regions 3a extending in the X direction and a plurality of FWD regions 3b extending in the X direction. The IGBT regions 3a and the FWD regions 3b are alternately arranged in a row in the Y direction. In FIG. 5, four IGBT regions 3a and three FWD regions 3b are arranged.

Particularly in FIG. 5, the IGBT regions 3a and the FWD regions 3b extend in a direction intersecting the linear portion 33 of the gate runner 31 (X direction). In other words, the IGBT region 3a, the FWD region 3b, and the wiring member 4 extend in the same X direction in a planar view. The extension direction of the IGBT regions 3a and the FWD regions 3b may be referred to as a trench direction.

In the RC-IGBT element, an electric current is likely to flow in the trench direction. In other words, the RC-IGBT element has directivity in a flow direction of an electric current. Specifically, the main electric current flows from the gate pad 30 into the outer peripheral portion 32 and the linear portion 33 of the gate runner 31. And then, the main electric current flows from the linear portion 33, in each of the IGBT regions 3a and the FWD regions 3b, to both sides in the X direction along the trench direction.

In addition, since the wiring member 4 through which the main electric current passes extends in the same direction as the trench direction, the flow direction of the main electric current converges in one direction (X direction) in the module as a whole. As a result, flow distribution of the electric current flow is homogenized, whereby suppression of noise and vibration is enabled, and furthermore, prevention of local heat generation is enabled.

In addition, in the present embodiment, the IGBT region 3a preferably has a greater width than the FWD region 3b. According to this configuration, equalization of electric current allotment between these regions is enabled, and anomalous heating and breakage of one of these regions can be suppressed.

In addition, in the present embodiment, the wiring member 4 preferably has at least one connecting point overlapping both the IGBT region 3a and the FWD region 3b in a planar view. For example, the IGBT and the FWD are switched on and off at opposite timing, and have different timing of electric current flow. The connecting point overlapping only one of these regions may lead to local heat generation. Consequently, the connecting point overlapping both regions enables homogenization of heat distribution and in turn suppression of local heat generation.

As described above, according to the present embodiment, arranging the gate runner 31 (linear portion 33) to pass under the arch-shaped wiring member 4 makes it possible to secure the number of wires being connected, and in turn to improve heat resistance.

Hereinafter, a modification is described with reference to FIG. 8 to FIG. 12. FIG. 8 to FIG. 12 are plan views of the vicinity of a semiconductor element according to the modification.

Figure 8:
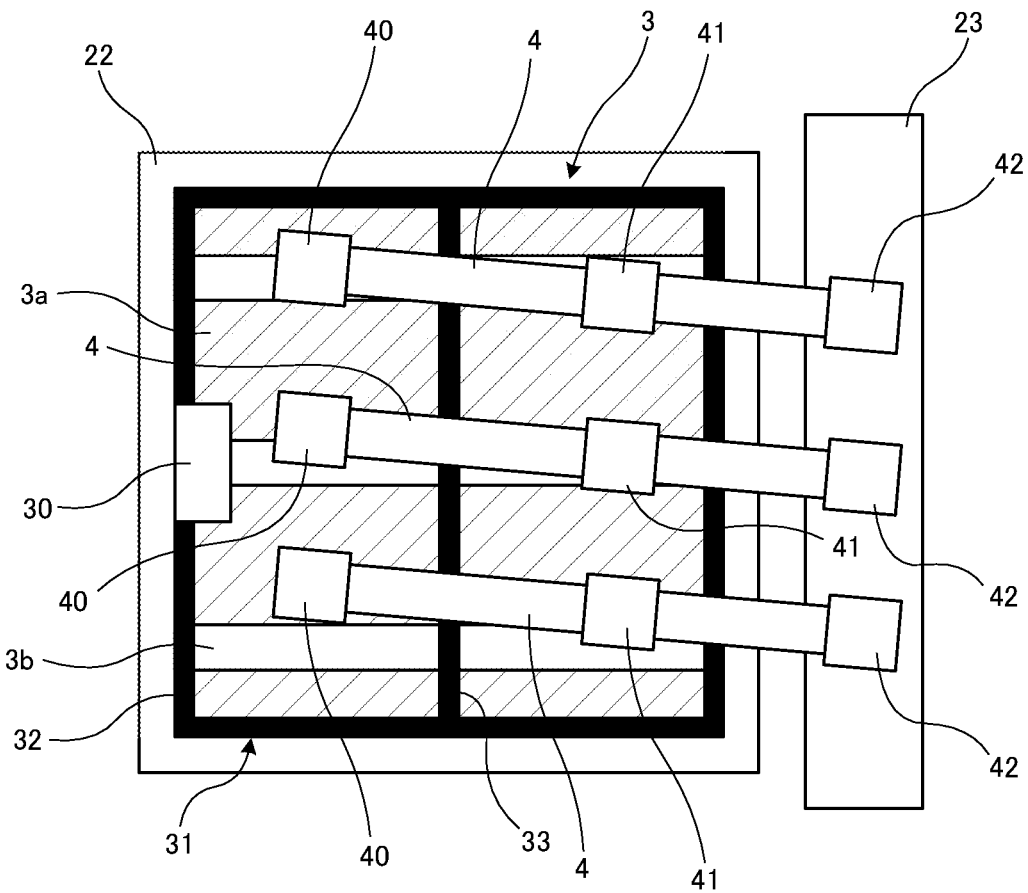
FIG. 8 is a plan view of the vicinity of a semiconductor element according to a modification.

For example, in the above-described embodiment, the case in which the wiring member 4 extends in parallel to the extension direction of the IGBT regions 3a and the FWD regions 3b has been described; however, the present invention is not limited to this configuration. For example, as shown in FIG. 8, the wiring member 4 may be inclined with respect to the extension direction of the IGBT region 3a and the FWD region 3b in a planar view. In other words, the wiring member 4 is only required to cross over the gate runner 31 (linear portion 33).

Figure 9:
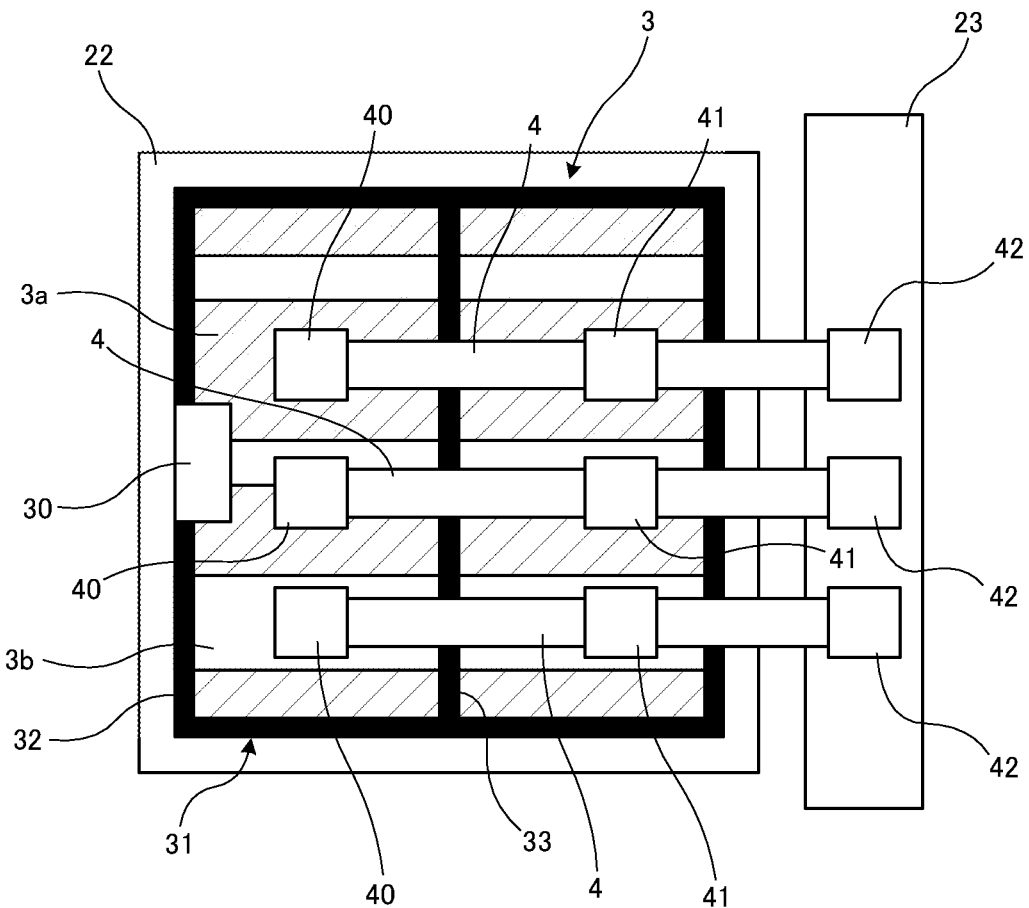
FIG. 9 is a plan view of the vicinity of the semiconductor element according to the modification.

In addition, in the above-described embodiment, the case in which each connecting point of the wiring member 4 overlaps the IGBT region 3a and the FWD region 3b in a planar view has been described; however, the present invention is not limited to this configuration. For example, as shown in FIG. 9, there may be a connecting point overlapping only one of the IGBT region 3a and the FWD region 3b.

Figure 10:
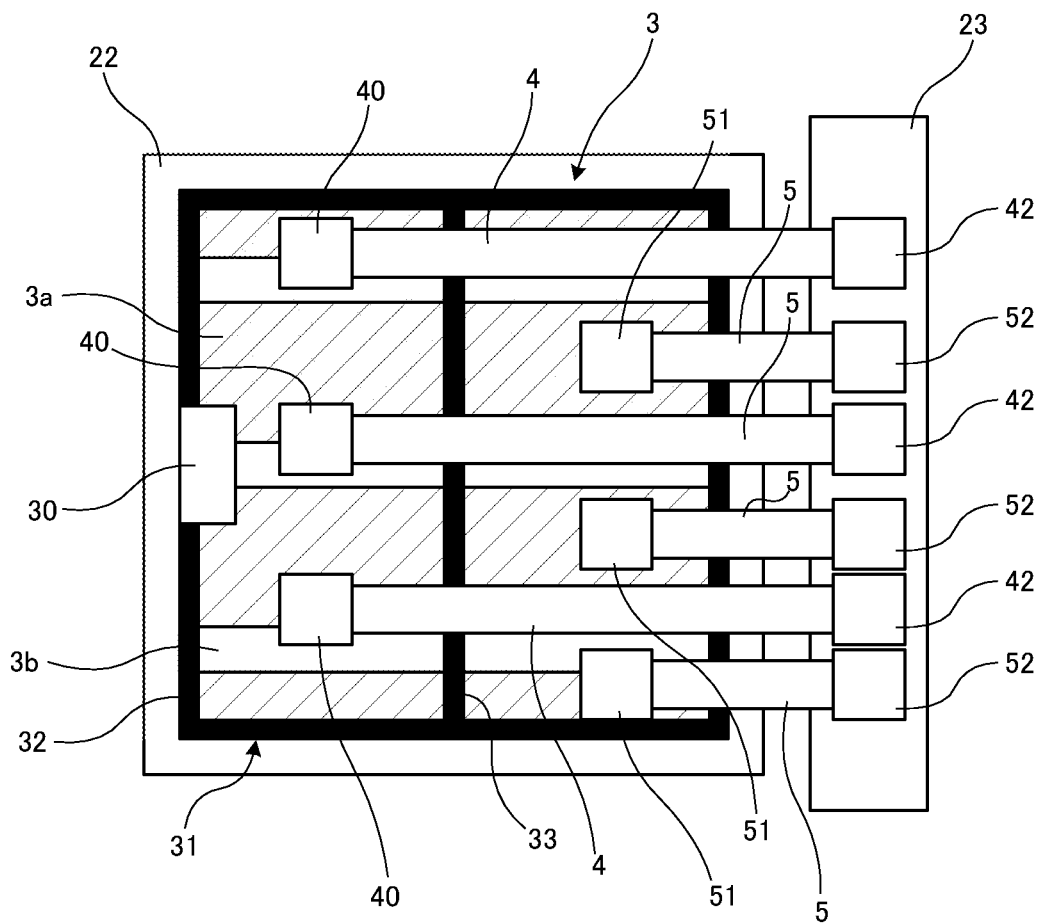
FIG. 10 is a plan view of the vicinity of the semiconductor element according to the modification.

In addition, in the above-described embodiment, the case in which the wiring member 4 is stitch bonded has been described; however, the present invention is not limited to this configuration. For example, as shown in FIG. 10, there may be only one connecting point per wiring member on the semiconductor element 3. In FIG. 10, a wiring member 5 (second wiring member), which is shorter than the wiring member 4, is arranged in addition to the wiring member 4. The wiring member 4 crosses over the linear portion 33 and a part of the outer peripheral portion 32 positioned on the negative side in the X direction. The connecting point 40 of the wiring member 4 is positioned on the negative side in the X direction with respect to the linear portion 33. To the contrary, the wiring member 5 does not cross over the linear portion 33, but crosses over a part of the outer peripheral portion 32 positioned on the negative side in the X direction. The connecting point 51 of the wiring member 5 is positioned on the positive side in the X direction with respect to the linear portion 33. In addition, the connecting point 52 of the wiring member 5 is arranged on the circuit board 23.

Figure 11:
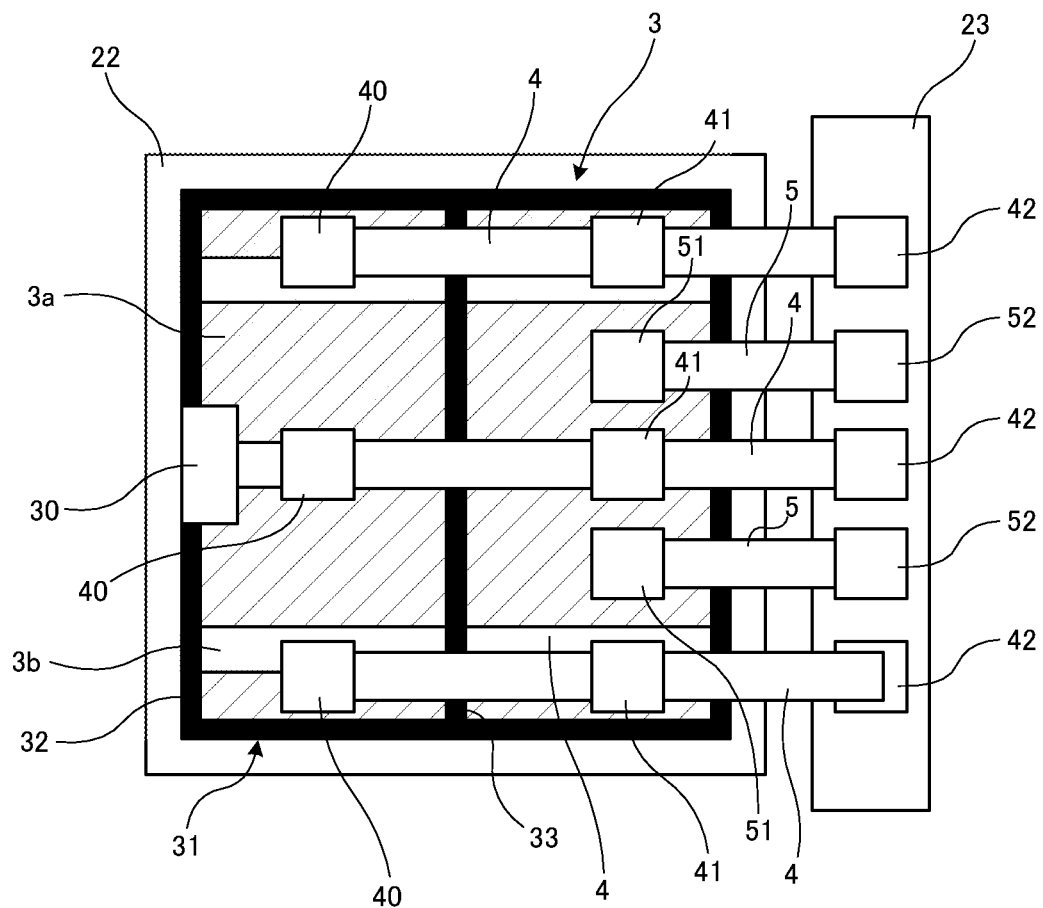
FIG. 11 is a plan view of the vicinity of the semiconductor element according to the modification.

In addition, in the above-described embodiment, the case in which in the semiconductor element 3, the number of the connecting points of the wiring member is the same on the negative side and on the positive side in the X direction with respect to the linear portion 33 has been described; however, the present invention is not limited to this configuration. For example, as shown in FIG. 11, the number of connecting points of the wiring members 4, 5 may be greater on the positive side in the X direction, which is the other side, than on the negative side in the X direction, which is the one side.

Figure 12:
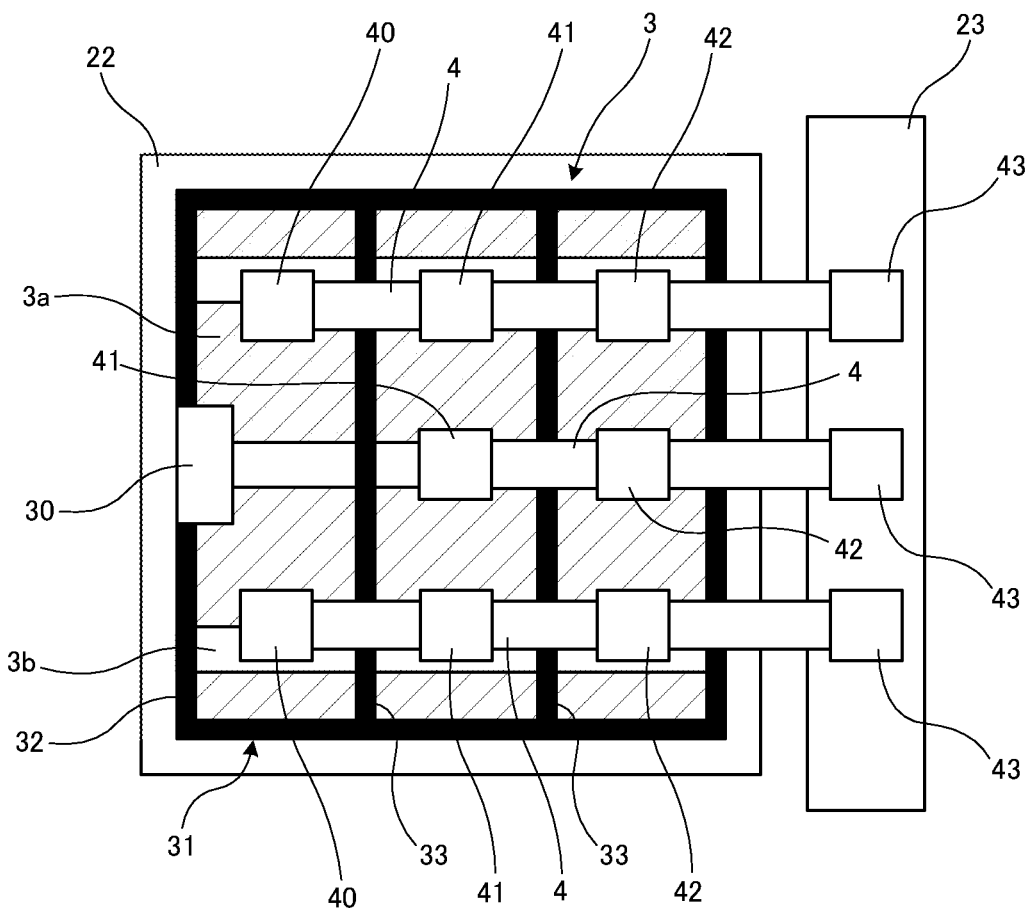
FIG. 12 is a plan view of the vicinity of the semiconductor element according to the modification.

In addition, in the above-described embodiment, the case in which the linear portion 33, which is a part of the gate runner 31, extends in the Y direction in the center of the outer peripheral portion 32 to divide the upper electrode into two has been described; however, the present invention is not limited to this configuration. For example, the configuration shown in FIG. 12 may be employed. In FIG. 12, two linear portions 33 extending in the Y direction are continued from sides of the outer peripheral portion 32 opposite to each other in the Y direction. The two linear portions 33 divide the upper electrode into three regions in the X direction. The wiring member 4 may have the connecting points 40 to 42 in each of the regions thus divided. In addition, the connecting point 43, which is an end portion of the wiring member 4, is arranged on the circuit board 23.

Figure 13:
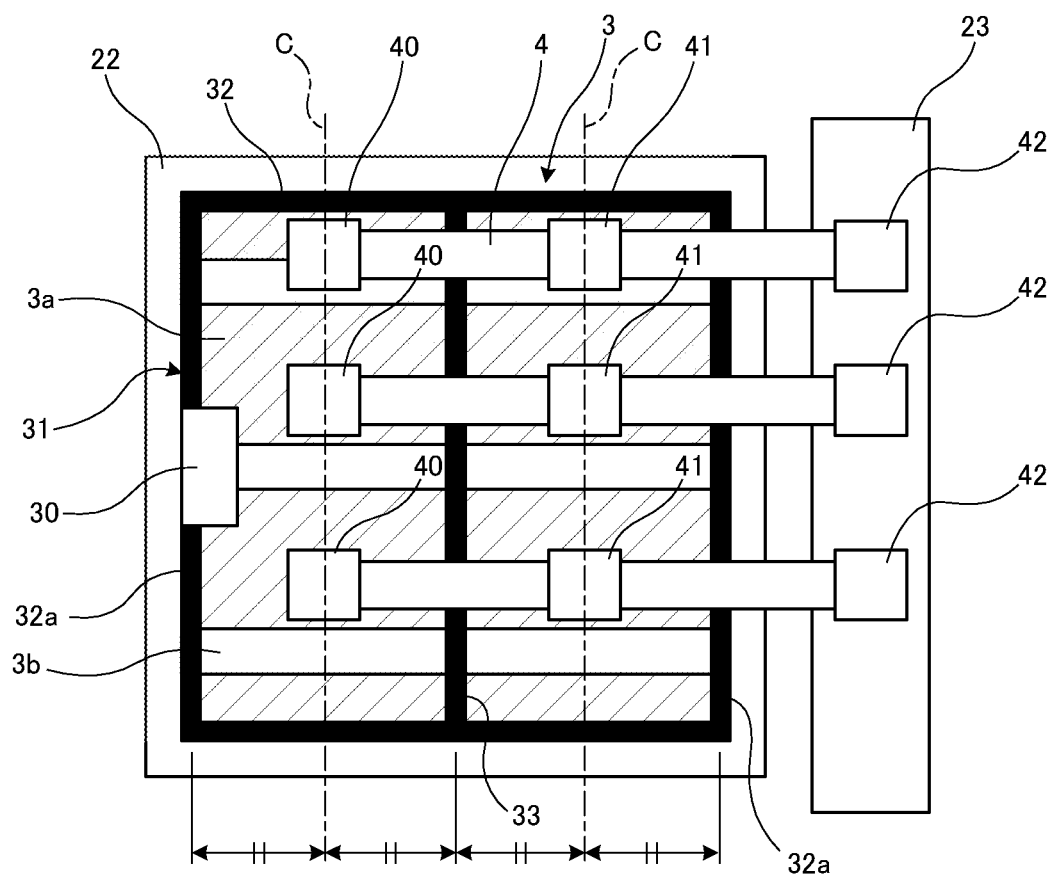
FIG. 13 is a plan view of the vicinity of the semiconductor element according to a second embodiment.

Hereinafter, a second embodiment is described with reference to FIG. 13 to FIG. 15. FIG. 13 is a plan view of the vicinity of a semiconductor element according to a second embodiment. FIG. 14 is a partial enlarged view of FIG. 13. FIG. 15 is a plan view of the vicinity of a semiconductor element according to a modification of the second embodiment. Note that, in the following, only the layout of the wiring member (particularly bonded portions) is different from the above-described embodiment. Common configurations are therefore denoted by the same reference symbols and description thereof is omitted as appropriate.

As described above, in order to ensure the resistance of the semiconductor module, it is required to take into consideration the amount of heat generation of the wiring member. For example, even in a period of time as short as several milliseconds required for starting up operation of the semiconductor module, local heat generation (heat radiation) occurs in the vicinity of a chip. On the reverse face side of the chip, heat is radiated via solder and an insulating substrate, while on the front face side of the chip, heat is radiated via the wiring member (bonding wire). In this case, the connecting point (bonding point) of the wiring member in the vicinity of the outer periphery of the chip may lead to an insufficient heat radiation area.

Particularly in the RC-IGBT element in which the IGBT and the FWD are integrated, the IGBT regions and the FWD regions are formed in strip shapes extending in the predetermined direction, as described above. Consequently, in a period of time as short as several milliseconds required for starting up, heat is radiated not from an entire surface of the chip, but in an off-center manner in strip shapes. In other words, compared to the case in which the IGBT and the FWD are separated, the heat radiation area is smaller in the short period of time, resulting in a problem of increased transient thermal resistance.

Given this, the present inventor has further focused on the heat radiation distribution and layout of wiring members in the RC-IGBT element, and thus conceived the present invention.

As shown in FIG. 13, in the second embodiment, the plurality of IGBT regions 3a and the plurality of FWD regions 3b extending in strip shapes along the Y direction are arranged alternately in a row. In addition, the gate runner 31 is arranged to surround the outer periphery of the semiconductor element 3. As described above, the gate runner 31 is formed in a rectangular frame shape surrounding the entire outer peripheral edge of the semiconductor element 3. Specifically, the gate runner 31 includes an outer peripheral portion 32 and a linear portion 33.

The outer peripheral portion 32 extends from the gate pad 30 along the outer peripheral edge of the semiconductor element 3. More specifically, the outer peripheral portion 32 is formed to extend from both end portions of the gate pad 30 in the Y direction, along the outer peripheral edge of the semiconductor element 3, and to surround the outer peripheral edge of the semiconductor element 3 (outer peripheral edge of the upper face electrode), thus forming a rectangular frame shape. The linear portion 33 connects sides of the outer peripheral portion 32 opposite to each other in the Y direction, in a center in the X direction. The linear portion 33 extends in the Y direction so as to divide a center of the semiconductor element 3. In other words, the linear portion 33 divides the upper face (upper face electrode) of the semiconductor element into one side (negative side in the X direction) and the other side (positive side in the X direction).

Hereinafter, the linear portion 33 is referred to as a first linear portion 33, and two linear portions in the outer peripheral portion 32 arranged opposite to the first linear portion 33 are each referred to as a second linear portion 32a. The second linear portion 32a is constituted of a part of the outer peripheral portion 32 extending from the gate pad 30 along the outer peripheral edge of the semiconductor element 3. Such an outer peripheral portion 32 constitutes a heat resistant structure portion of the semiconductor element 3.

As described above, the first linear portion 33 is continued from the outer peripheral portion 32 and extends to divide a center of the semiconductor element 3. Meanwhile, the first linear portion 33 is positioned in a center between the two second linear portions 32a. The first linear portion 33 and the two second linear portions 32a are parallel to each other along the Y direction, and extend in a direction intersecting the extension direction (X direction) of the IGBT regions 3a and the FWD regions 3b.

In addition, the wiring member 4 extends in the X direction above the semiconductor element 3, and is arranged to cross over the first linear portion 33 and the second linear portions 32a. As described above, the wiring member 4 is electrically connected to the main electrode and the predetermined circuit board 23 by stitch bonding, with a plurality of connecting points (bonding points) 40, 41, 42. In addition, in FIG. 13, three wiring members 4 are arranged in a row in the Y direction.

The connecting point 40 is arranged in a rectangular region on the negative side in the X direction, within a region in a rectangular shape in a planar view surrounded by the gate runner 31. In addition, the connecting point 40 is arranged to overlap a center line C positioned at an equal distance from the first linear portion 33 and the second linear portion 32a in a planar view. The center line C extends between the first linear portion 33 and the second linear portion 32a, parallel to the first linear portion 33 and the second linear portion 32a.

The connecting point 41 is arranged in a rectangular region on the positive side in the X direction, within a region in a rectangular shape in a planar view surrounded by the gate runner 31. In a similar manner to the connecting point 40, the connecting point 41 is also arranged to overlap a center line C positioned at an equal distance from the first linear portion 33 and the second linear portion 32a in a planar view.

As described above, providing the connecting points 40, 41 at an equal distance from the gate runner 31 (the first linear portion 33 and the second linear portion 32a) extending in the Y direction enables homogenization of the heat radiation area to the maximum. As a result, reduction in transient thermal resistance, and in turn reduction of temperature ripple, are enabled.

In addition, in FIG. 13, entirety or a major part of the connecting points 40, 41 overlaps the IGBT region 3a in a planar view. Upon starting up of the semiconductor module, an electric current flows from the IGBT region 3a. Suppression of transient thermal resistance in a short period of time and prevention of local heat generation upon starting up are thus enabled.

In addition, in the foregoing, the case in which the connecting points 40, 41 are formed in rectangular shapes (substantially square shapes) in a planar view has been described; however, the present invention is not limited to this configuration. For example as shown in FIGS. 14A and 14B, each of the connecting points 40, 41 may have an oval shape elongated in the extension direction (X direction) of the wiring member 4 in a planar view.

Figure 14A:
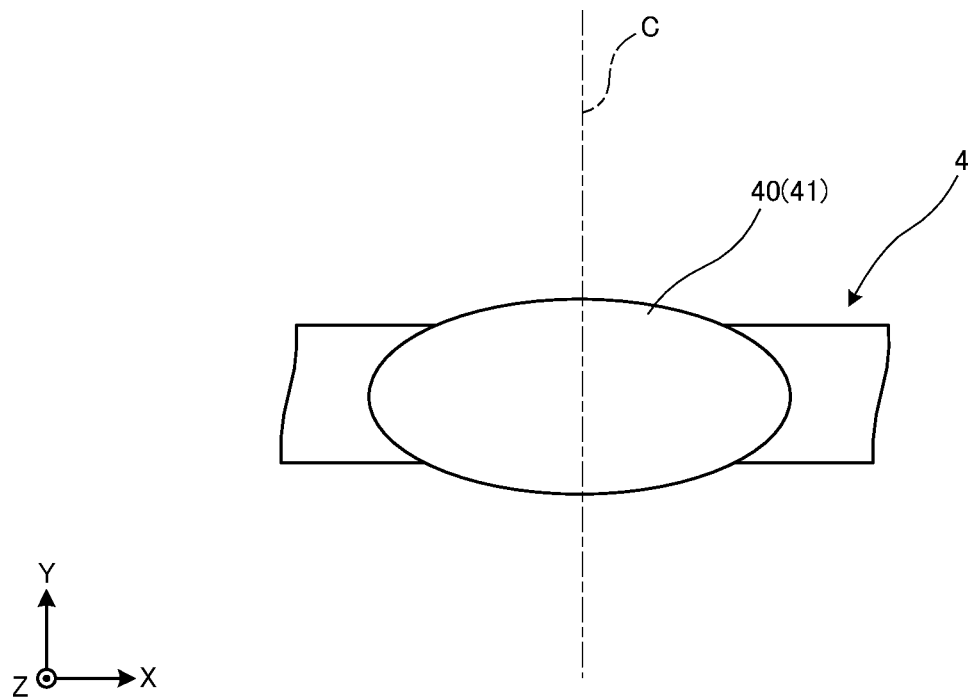
FIGS. 14A and 14B are partial enlarged views of FIG. 13.
Figure 14B:
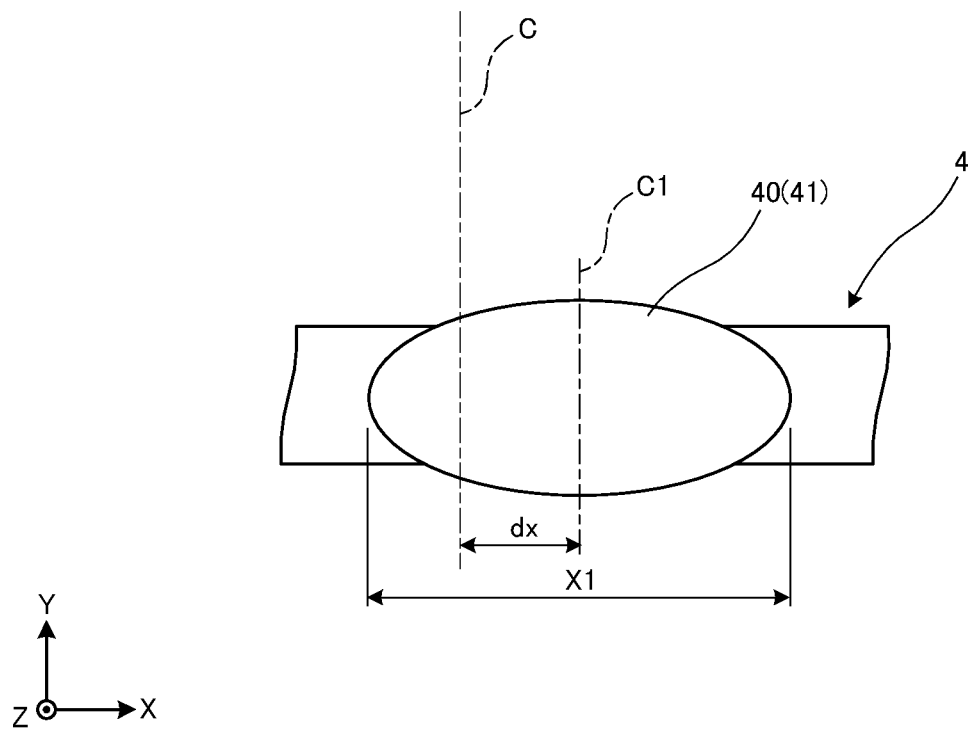
Figure 15:
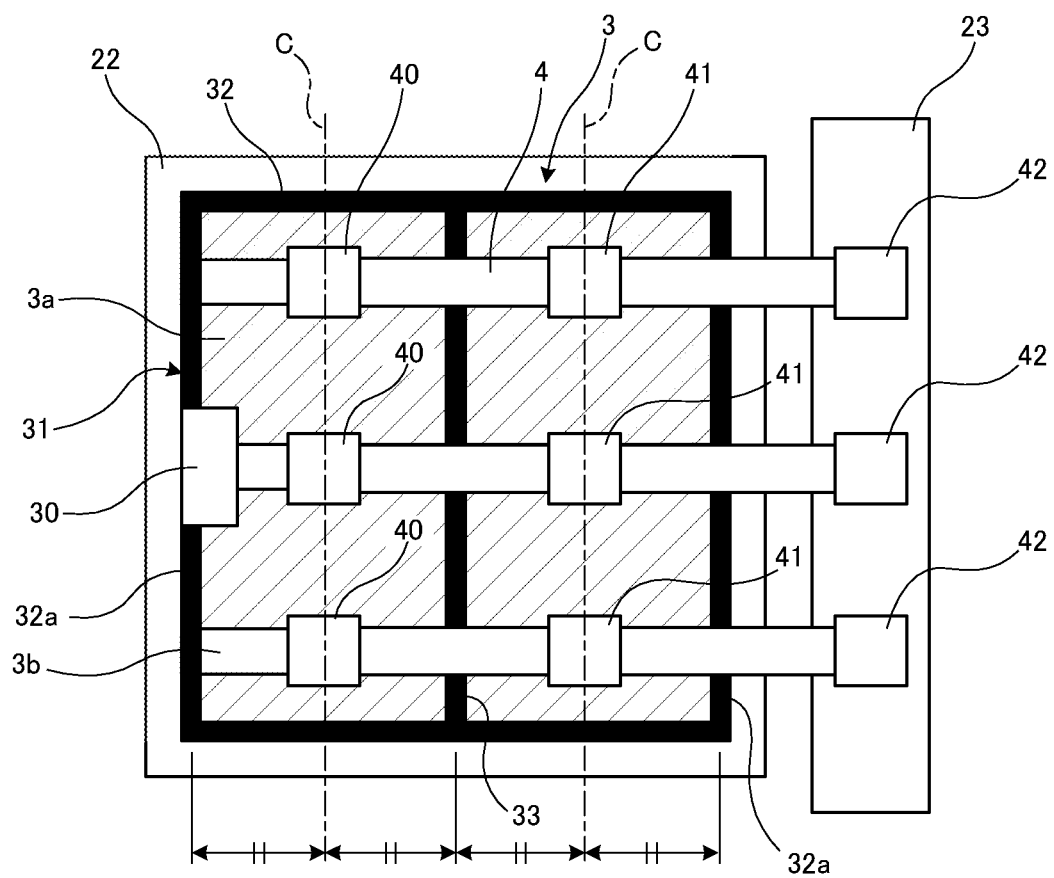
FIG. 15 is a plan view of the vicinity of a semiconductor element according to a modification of the second embodiment.
Figure 15:
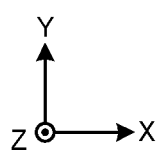

In addition, in the foregoing, the case in which the center line C and a center line of the connecting points 40, 41 overlap (correspond) as shown in FIG. 14A has been described; however, the present invention is not limited thereto and may be modified as appropriate. For example as shown in FIG. 14B, it is only required that at least a part of the connecting points 40, 41 overlap the center line C, and the center line C1 of the connecting points 40, 41 in the X direction (longitudinal direction) and the center line C do not necessarily correspond.

For example, when a distance between the center line C and the center line C1 is dx, and a width of the connecting points 40, 41 in the longitudinal direction is X1, it is preferred that a relationship $0 \leq dx \leq X1$ is satisfied. This range enables sufficient exertion of the above-described effects.

In addition, in FIG. 13, the case in which entirety or a major part of the connecting points 40, 41 overlaps the IGBT region 3a in a planar view has been described; however, the present invention is not limited to this configuration. For example, as shown in FIG. 15, entirety or a major part of the connecting points 40, 41 may be arranged to overlap the FWD region 3b in a planar view. In this case, local heat generation can be suppressed when an electric current flows in the FWD region 3b due to a counter electromotive force.

In addition, in the above-described embodiment, the number and layout of the circuit boards are not limited to the above-described configuration and may be modified as appropriate.

In addition, in the above-described embodiment, the case in which the laminated substrate 2 and the semiconductor elements are formed in rectangular shapes or square shapes in a planar view has been described; however, the present invention is not limited to this configuration. The laminated substrate 2 and the semiconductor elements may be formed in polygonal shapes other than the aforementioned ones.

The present embodiment and the modification have been described. The above-described embodiment and the modification may be entirely or partially combined to give another embodiment.

In addition, the present embodiment is not limited to the above-described embodiment and the modification, and may be subjected to various changes, substitutions, or modifications without departing from the spirit of the technical idea. Furthermore, if the technical idea can be realized by other methods with technical evolution or other derived techniques, the present invention may also be embodied by such methods. Therefore, the claims encompass all potential modes of carrying out the invention within the scope of the technical idea.

Hereinafter, the characteristic features of the above-described embodiment are summarized.

The semiconductor module according to the above-described embodiment includes: a laminated substrate in which a plurality of circuit boards are arranged on an upper face of an insulating board; a semiconductor element arranged on a predetermined circuit board and having on an upper face a main electrode, a gate pad, and a gate runner electrically connected to the gate pad; and a wiring member electrically connecting the main electrode with other circuit boards, in which: the gate runner extends to divide the main electrode into one side and other side; and the wiring member is arranged to cross over the gate runner.

In the semiconductor module according to the above-described embodiment: the semiconductor element has a rectangular shape in a planar view; the gate pad is arranged on a side of the semiconductor element corresponding to the one side; the other circuit boards are arranged on an opposite face of the gate pad, across another side of the semiconductor element corresponding to the other side; and the gate runner and the wiring member intersect in a planar view.

In the semiconductor module according to the above-described embodiment, the gate runner extends to divide a center of the upper face of the semiconductor element and divides the main electrode into at least two.

In the semiconductor module according to the above-described embodiment, the wiring member is constituted of a plurality of conductor wires.

The semiconductor module according to the above-described embodiment further includes a second wiring member that is shorter than the wiring member and has at least one connecting point on the other side.

In the semiconductor module according to the above-described embodiment, the wiring member has at least one connecting point on the one side on the upper face of the semiconductor element.

In the semiconductor module according to the above-described embodiment, the number of the connecting points of the wiring member and the second wiring member is greater on the other side than on the one side.

In the semiconductor module according to the above-described embodiment, the number of the connecting points of the wiring member and the second wiring member is the same on the one side and on the other side.

In the semiconductor module according to the above-described embodiment: the semiconductor element is an RC (Reverse Conducting)-IGBT (Insulated Gate Bipolar Transistor) element in which an IGBT and an FWD (Free Wheeling Diode) are integrated and further comprises a plurality of IGBT regions and a plurality of FWD regions extending in strip shapes in a planar view; and the plurality of IGBT regions and the plurality of FWD regions are arranged alternately.

In the semiconductor module according to the above-described embodiment, the IGBT region and the FWD region extend in a direction intersecting the gate runner.

In the semiconductor module according to the above-described embodiment, the IGBT region has a greater width than the FWD region.

In the semiconductor module according to the above-described embodiment, the wiring member is inclined with respect to an extension direction of the IGBT region and the FWD region in a planar view.

In the semiconductor module according to the above-described embodiment, the wiring member comprises at least one connecting point that overlaps both the IGBT region and the FWD region in a planar view.

In the semiconductor module according to the above-described embodiment: the semiconductor element has a rectangular shape in a planar view and further comprises a gate pad arranged on a side of the rectangular shape; the gate runner includes an outer peripheral portion extending from the gate pad along an outer peripheral edge of the semiconductor element and a linear portion continued from the outer peripheral portion and extending to divide a center of the semiconductor element; and the wiring member is arranged to cross over the linear portion and/or the outer peripheral portion.

The semiconductor module according to the above-described embodiment includes: a laminated substrate in which a plurality of circuit boards are arranged on an upper face of an insulating board; a semiconductor element arranged on a predetermined circuit board and having on an upper face a main electrode, a gate pad, and a gate runner electrically connected to the gate pad; and a wiring member electrically connecting the main electrode with other circuit boards, wherein: the semiconductor element is an RC (Reverse Conducting)-IGBT (Insulated Gate Bipolar Transistor) element in which an IGBT and an FWD (Free Wheeling Diode) are integrated and further comprises a plurality of IGBT regions and a plurality of FWD regions extending in strip shapes in a planar view and arranged alternately; the gate runner comprises a first linear portion extending to divide the main electrode into one side and other side and a second linear portion arranged opposite to the first linear portion and extending along an outer peripheral edge of the semiconductor element; the first linear portion and the second linear portion extend in a direction intersecting the IGBT region and the FWD region; the wiring member is arranged to cross over at least the first linear portion; and at least a part of a connecting point to the main electrode overlaps a center line positioned at an equal distance from the first linear portion and the second linear portion in a planar view.

In the semiconductor module according to the above-described embodiment, the center line extends between the first linear portion and the second linear portion, parallel to the first linear portion and the second linear portion.

In the semiconductor module according to the above-described embodiment: the semiconductor element has a rectangular shape in a planar view; the gate pad is arranged on a side of the rectangular shape; the second linear portion is constituted of a part of an outer peripheral portion extending from the gate pad along an outer peripheral edge of the semiconductor element; the outer peripheral portion constitutes a heat resistant structure portion of the semiconductor element; and the first linear portion is continued from the outer peripheral portion and extends to divide a center of the semiconductor element.

In the semiconductor module according to the above-described embodiment: the wiring member extends in a direction intersecting the first linear portion in a planar view; and the connecting point of the wiring member has an oval shape elongated in an extension direction of the wiring member in a planar view.

In the semiconductor module according to the above-described embodiment, the connecting point of the wiring member overlaps the IGBT region in a planar view.

In the semiconductor module according to the above-described embodiment, the connecting point of the wiring member overlaps the FWD region in a planar view.

INDUSTRIAL APPLICABILITY

As described in the foregoing, the present invention produces an effect of making it possible to secure the number of main wires being connected, and in turn to improve heat resistance, and is particularly useful for a semiconductor module.

The present application is based on Japanese Patent Application No. 2020-117233 filed on Jul. 7, 2020. The content thereof is incorporated herein by reference.

What is claimed is:

1. A semiconductor module, comprising:
a laminated substrate including an insulating board and a plurality of circuit boards that are arranged on an upper face of the insulating board, the plurality of circuit boards including first and second circuit boards;
a semiconductor element disposed on the first circuit board and including, on an upper face of the semiconductor element, a main electrode having first and second sides, a gate pad, and a gate runner electrically connected to the gate pad; and
a plurality of first wiring members each electrically connecting the main electrode to the second circuit board, wherein:

the gate runner extends so as to divide the main electrode into a plurality of electrodes including a first main electrode at the first side and a second main electrode at the second side;

each first wiring member is arranged to cross over the gate runner, the semiconductor element is an RC (Reverse Conducting)-IGBT (Insulated Gate Bipolar Transistor) element in which a plurality of IGBTs and a plurality of FWDs (Free Wheeling Diodes) are integrated, and further includes plural, alternately arranged, IGBT regions and FWD regions, each having a strip shape that extends in a direction nonparallel with a direction in which the gate runner extends, the main electrode has a plurality of connecting areas each connected to one of the plurality of first wiring members, each first wiring member having at least one of the plurality of connecting areas so that each of the first and second main electrodes has at least one connecting area among the plurality of connecting areas, the plurality of connecting areas being arranged so that a total area of connecting areas overlapping the IGBT regions differs from a total area of connecting areas overlapping the FWD regions.

2. The semiconductor module according to claim 1, wherein:

the semiconductor element has a rectangular shape with four side faces in a plan view of the semiconductor module, the four side faces including a first side face and a second side face opposite to the first side face;

the gate pad is disposed adjacent to the first side face of the semiconductor element, the first side face being located at the first main electrode;

the second circuit board faces the second side face of the semiconductor element, the second side face being located at the second main electrode; and the gate runner intersects each first wiring member in the plan view.

3. The semiconductor module according to claim 1, wherein each first wiring member is separately constituted of an individual conductor wire.

4. The semiconductor module according to claim 1, further comprising a second wiring member that is shorter than each first wiring member, wherein each first wiring member has at least one first connecting area at the first main electrode, and the second wiring member has at least one second connecting area at the second main electrode, each first wiring member and the first main electrode being connected to each other in each of the at least one first connecting area, the second wiring member and the second main electrode being connected to each other in each of the at least one second connecting area.

5. The semiconductor module according to claim 4, wherein a total number of the first and second connecting areas in the second main electrode is greater than a total number of the first and second connecting areas in the first main electrode.

6. The semiconductor module according to claim 4, wherein a total number of the first and second connecting areas in the first main electrode is the same as a total number of the first and second connecting areas in the second main electrode.

7. The semiconductor module according to claim 1, wherein:

the plurality of electrodes includes at least three electrodes; and each first wiring member has at least one connecting area in each of the at least three electrodes on the upper face of the semiconductor element, each first wiring member and the main electrode being connected to each other at each of the at least one connecting area.

8. The semiconductor module according to claim 1, wherein each first wiring member has a plurality of connecting areas at the main electrode on the upper face of the semiconductor element, each first wiring member and the main electrode being connected to each other in each of the plurality of connecting areas, and the plurality of connecting areas of each first wiring member is arranged in an off-center manner with respect to areas where the plurality of IGBT regions are disposed.

9. The semiconductor module according to claim 1, wherein the plurality of IGBT regions each have a width greater than a width of each of the plurality of FWD regions.

10. The semiconductor module according to claim 1, wherein each first wiring member is inclined with respect to a direction in which each of the plurality of IGBT regions and each of the plurality of FWD regions extend in a plan view of the semiconductor module.

11. The semiconductor module according to claim 1, wherein each first wiring member includes at least one connecting area that overlaps both one of the plurality of IGBT regions and one of the plurality of FWD regions in a plan view of the semiconductor module, each first wiring member and the main electrode being connected to each other in each of the at least one connecting area.

12. The semiconductor module according to claim 1, wherein:

the semiconductor element has a rectangular shape with four side faces in a plan view of the semiconductor module and the gate pad is disposed adjacent to one side face among the four side faces of the semiconductor element;

the gate runner includes an outer peripheral portion extending from the gate pad along an outer peripheral edge of the semiconductor element, and a linear portion continuing from the outer peripheral portion and passing through a center of the semiconductor element in the plan view, so as to divide the main electrode into the plurality of electrodes; and each first wiring member is arranged to cross over the linear portion and/or the outer peripheral portion.

13. The semiconductor module according to claim 1, wherein the total area of connecting areas overlapping the IGBT regions is greater than the total area of connecting areas overlapping the FWD regions.

14. The semiconductor module according to claim 1, wherein the total area of connecting areas overlapping the IGBT regions is less than the total area of connecting areas overlapping the FWD regions.

15. A semiconductor module, comprising:

a laminated substrate including an insulating board and a plurality of circuit boards that are arranged on an upper surface of the insulating board, the plurality of circuit boards including first and second circuit boards;

a semiconductor element disposed on a first circuit board and including, on an upper surface of the semiconductor element, a main electrode, a gate pad, and a gate runner electrically connected to the gate pad; and a plurality of first wiring members each electrically connecting the main electrode to the second circuit board, wherein:

the semiconductor element is an RC (Reverse Conducting)-IGBT (Insulated Gate Bipolar Transistor) element in which a plurality of IGBTs and a plurality of FWDs (Free Wheeling Diodes) are integrated, and includes alternately arranged, plural IGBT regions and plural FWD regions, that each have a strip shape;

the gate runner includes a first linear portion extending so as to divide the main electrode into a first main electrode at a first side and a second main electrode at a second side and a second linear portion parallel to the first linear portion and extending along an outer peripheral edge of the semiconductor element;

the first linear portion and the second linear portion extend in a direction intersecting with a direction in which each of the plurality of IGBT regions and each of the plurality of FWD regions extend; and each first wiring member is arranged to cross over the first linear portion, wherein the main electrode has a plurality of connecting areas, each first wiring member having at least one connecting area connected to the main electrode so that each of the first and second main electrodes has at least one connecting area among the plurality of connecting areas, at least a part of each connecting area overlapping a center line positioned at an equal distance from the first linear portion and the second linear portion in a plan view of the semiconductor module, and the plurality of connecting areas is arranged so that a total area of connecting areas overlapping the IGBT regions differs from a total area of connecting areas overlapping the FWD regions.

16. The semiconductor module according to claim 15, wherein the center line extends between the first linear portion and the second linear portion in a direction parallel to the first linear portion and the second linear portion.

17. The semiconductor module according to claim 15, wherein:

the semiconductor element has a rectangular shape with four side faces in the plan view;

the gate pad is disposed adjacent to one side face among the four side faces;

the second linear portion is constituted of a part of an outer peripheral portion extending from the gate pad along an outer peripheral edge of the semiconductor element;

the outer peripheral portion constitutes a heat resistant portion of the semiconductor element; and the first linear portion continues from the outer peripheral portion and passes through a center of the semiconductor element in the plan view so as to divide the main electrode into the first and second main electrodes.

18. The semiconductor module according to claim 15, wherein:

each first wiring member extends in a first direction nonparallel with a second direction in which the first linear portion extends in the plan view; and the connecting area of each first wiring member has an oval shape elongated in the first direction.

19. The semiconductor module according to claim 15, wherein the connecting area of each first wiring member overlaps both one of the IGBT regions and one of the FWD regions in the plan view.

* * * * *